United States Patent [19]
Hillis

[11] Patent Number: 5,212,484
[45] Date of Patent: May 18, 1993

[54] DIGITAL TO ANALOG CONVERTER SYSTEM EMPLOYING PLURAL DIGITAL TO ANALOG CONVERTERS WHICH IS INSENSITIVE TO RESISTANCE VARIATIONS

[75] Inventor: W. Daniel Hillis, Cambridge, Mass.

[73] Assignee: Thinking Machines Corporation, Cambridge, Mass.

[21] Appl. No.: 820,421

[22] Filed: Jan. 14, 1992

Related U.S. Application Data

[63] Continuation-in-part of Ser. No. 489,079, Mar. 5, 1990, Pat. No. 5,118,975.

[51] Int. Cl.$^5$ .............................................. H03M 1/78
[52] U.S. Cl. ................................... 341/154; 341/141; 341/118
[58] Field of Search ................. 341/118, 141, 144, 154

[56] References Cited

U.S. PATENT DOCUMENTS

| | | | |
|---|---|---|---|
| 4,843,394 | 6/1989 | Linz et al. ............................ | 341/154 |
| 4,958,155 | 9/1990 | Gulczynski ........................... | 341/120 |
| 4,972,188 | 11/1990 | Clement et al. ..................... | 341/118 |
| 5,043,731 | 8/1991 | Nishimura ............................ | 341/154 |
| 5,118,975 | 6/1992 | Hillis et al. .......................... | 307/602 |
| 5,119,095 | 6/1992 | Asazawa ............................... | 341/154 |

Primary Examiner—Marc S. Hoff
Attorney, Agent, or Firm—Richard A. Jordan

[57] ABSTRACT

A digital to analog conversion system includes two digital to analog converters, a selector circuit and a control circuit. Each digital to analog converter generates an output signal having a voltage level which can be varied in response to a control signal. The selector circuit is connected to the digital to analog converters for selectively coupling as a system output signal the output signal from one of the digital to analog converters in response to a selection signal. The control circuit generates control signals for controlling the digital to analog converters and the selection signal for controlling the selector circuit to, during a series of iterations, effectively control alternate ones of the digital to analog converters to generate output signals of voltage levels which are adjusted in relation to the voltage level of the system output signal and enable the selector circuit to couple the adjusted output signal as the system output signal, to thereby enable the system output signal to approach a selected voltage level.

5 Claims, 1 Drawing Sheet

DIGITAL TO ANALOG CONVERTER SYSTEM EMPLOYING PLURAL DIGITAL TO ANALOG CONVERTERS WHICH IS INSENSITIVE TO RESISTANCE VARIATIONS

REFERENCE TO PRIOR APPLICATION AND INCORPORATION BY REFERENCE

This application is a continuation in part of U.S. patent application Ser. No. 07/489,079, filed Mar. 5, 1990, now U.S. Pat. No. 5,118,975, issued Jun. 2, 1992 by W. Daniel Hillis, et al, and entitled Digital Clock Buffer Circuit Providing Controllable Delay, assigned to the assignee of the present application, incorporated by reference.

FIELD OF THE INVENTION

The invention relates generally to the field of electronic circuits, and more specifically to the field of digital-to-analog converter systems and circuits, which generate a signal whose voltage is proportional to a numerical value represented by a digital word.

BACKGROUND OF THE INVENTION

Digital to analog circuits, like their counterpart analog to digital circuits, are used to provide interfaces between digital circuits and analog circuits. In digital circuits, processing is performed in connection with digital data words. Each data word comprises a predetermined number of data bits, and may represent, for example, a numerical value in connection with which processing, such as the performance of mathematical operations, may occur. Each data bit is represented by an electrical signal which may have predetermined voltage characteristics each representing one of the plurality of digital values that the bit may have. Typically, the precision with which a digital circuit can process digital data depends on the number of data bits provided by the circuit. Accordingly, if a circuit designer determines that a digital circuit requires additional precision, it is a relatively simple matter to add the circuitry to handle the additional bits that may be required to be processed.

In analog circuits, however, processing is performed in connection with the voltage or current levels of one or more input signals, which may represent data. Generally, analog circuits may process the data faster that a digital circuit might. However, the precision of an analog circuit is limited by the precision of the various electrical components, such as resistors, inductors, capacitors, and so forth, of which it is made, and analog circuits typically can process data at a somewhat lower precision than a digital circuit.

Digital processing has other advantages over analog, however, particularly in that words of digital data can be stored for long periods of time, whereas the storage of analog signals generally is limited to a relatively short length of time before its current or voltage level dissipates.

However, in many instances, analog circuitry is required. For example, data in scientific experiments is initially in analog form, and data acquisition circuitry must be able to capture it using analog circuitry. At some point, the data may be converted to digital form for storage and further processing. In addition, it is often convenient to display data, which has been processed in digital form, in analog form using a visual display, to give an observer a visual representation of the processed data. Interfaces between analog and digital systems are required in such instances.

Several basic types of digital to analog converter circuits are known, as is generally described in, for example, J. Millman, *Microelectronics: Digital and Analog Circuits And Systems* (New York: McGraw-Hill Book Company, 1979) at pp. 606–609. Generally, digital to analog converter circuits include an operational amplifier that amplifies a voltage at an input terminal, which voltage it receives from a resistor network. The resistor network is generally connected to two distinct reference voltages, one of them typically a ground voltage and receives a number of signals, each representative of the condition of bits of the digital word being "converted." The conditions of the diverse bits of the digital word effectively control selected ones of the resistors to connect resistors to one of the two reference voltages. If the resistance values of the resistors forming the resistor network could be made perfect, which could be quite expensive, changes in the numerical value of the digital word controlling the resistor network would result in a proportional change in the voltage applied to the input terminal of the operational amplifier and thus a proportional change in its output voltage level. However, manufacturing variations of the resistors used in implementing an actual digital to analog converter circuit of reasonable cost result in some tolerance in their actual resistor values, in which case changes in voltage levels generated by a digital to analog converter do not necessarily change in direct proportion to changes in the values of the digital word applied thereto. Indeed, the variations in resistance values may, in an actual circuit, be sufficiently large that changes in voltage levels may not be monotonic with changes from one value of the digital word to the next higher or lower value.

SUMMARY OF THE INVENTION

The invention provides a new and improved digital to analog conversion system for converting digital data values into proportional analog voltage levels, and a new digital to analog converter circuit for use therewith.

In one aspect, the digital to analog conversion system includes two digital to analog converters, a selector circuit and a control circuit. Each digital to analog converter generates an output signal having a voltage level which can be varied in response to a control signal. The selector circuit is connected to the digital to analog converters for selectively coupling as a system output signal the output signal from one of the digital to analog converters in response to a selection signal. The control circuit generates control signals for controlling the digital to analog converters and the selection signal for controlling the selector circuit to, during a series of iterations, effectively control alternate ones of the digital to analog converters to generate output signals of voltage levels which are adjusted in relation to the voltage level of the system output signal and enable the selector circuit to couple the adjusted output signal as the system output signal, to thereby enable the system output signal to approach a selected voltage level.

In another aspect, a digital to analog converter comprises an amplifier circuit and a resistor network. The amplifier circuit generates the output signals having a voltage level determined by the voltage level of an input signal at an input terminal. The resistor network comprising a plurality of series-connected resistors, a plurality of depending resistors, and a plurality of switch circuits. The series-connected resistors are connected between a selected base voltage and the input terminal of the amplifier circuit, connections between each pair of resistors defining a node. Each node has connected thereto one of the plurality of depending resistors. Each switch circuit is independently controllable to selectively connect the input terminal to the selected base voltage or to a selected reference voltage in response to a switch control signal. The resistance values of the resistors are constrained so that, if the resistance value of each of the series-connected resistors and the depending resistors is defined in accordance with a base value of R and a tolerance of $\epsilon$, the series connected resistors each have a nominal resistance value $R-\epsilon$, and the depending resistors each have a nominal resistance value $2(R+\epsilon)$.

BRIEF DESCRIPTION OF THE DRAWINGS

This invention is pointed out with particularity in the appended claims. The above and further advantages of this invention may be better understood by referring to the following description taken in conjunction with the accompanying drawings, in which the sole FIGURE is a diagram of a circuit, in block and logic-level form, of a digital to analog conversion system constructed in accordance with the invention.

DETAILED DESCRIPTION OF AN ILLUSTRATIVE EMBODIMENT

Figure 1:
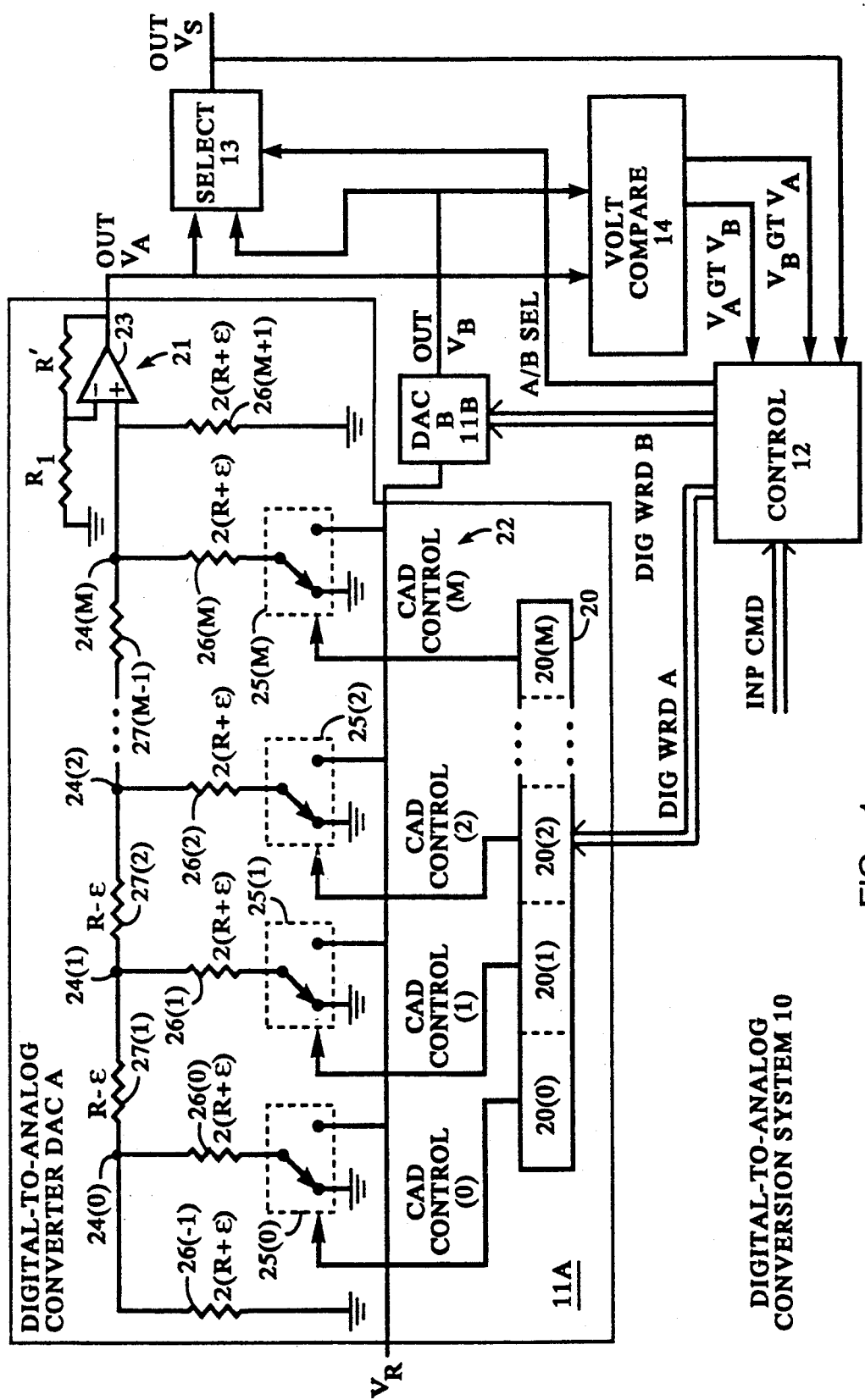

With reference to the sole Figure, a digital to analog conversion system 10 includes two digital to analog converters 11A and 11B [generally identified by reference numeral 11(i), with "i" representing indices "A" and "B"] and a control circuit 12. Each digital to analog converter 11(i) generates an OUT Vi output voltage signal having a voltage value which is proportional to the value represented by a digital word, represented by DIG WRD "i" digital word "i" signals ("i" representing indices "A" and "B") provided thereto by control circuit 12. The OUT Vi output voltage signals are coupled to a switch or selector circuit 13, which selectively couples one of the OUT Vi signals as an OUT Vs output selected voltage signal in response to the asserted or negated condition of an A/B SEL "A" or "B" select signal also from the control circuit 12.

The control circuit 12 generates the A/B SEL "A" or "B" select signal, as well as the DIG WRD "i" digital word signals, in response to an input command, represented by INP CMD input command signals, from external circuitry (not shown), the OUT VS output selected voltage signal from the selector circuit 13, and a $V_A$ GT $V_B$ voltage $V_A$ greater than voltage $V_B$ signal and a $V_B$ GT $V_A$ voltage $V_B$ greater than voltage $V_A$ signal, which are provided by a voltage comparator circuit 14. The voltage comparator circuit 14 comprises a comparator circuit that compares the voltage levels of the OUT VA and OUT VB signals. The voltage comparator circuit 14 asserts the $V_A$ GT $V_B$ signal, and negates the $V_B$ GT $V_A$ signal, when it detects that the voltage level of the OUT VA signal is greater than that of the OUT VB signal. On the other hand, the voltage comparator circuit 14 negates the $V_A$ GT $V_B$ signal and asserts the $V_B$ GT $V_A$ signal, when it detects that the voltage level of the OUT VB signal is greater than the voltage level of the OUT VA signal.

The digital to analog converters 11i are preferably similar to each other, and may comprise any conventional digital to analog converter circuit, circuits for which are described in the aforementioned J. Millman, *Microelectronics: Digital and Analog Circuits And Systems* (New York: McGraw-Hill Book Company, 1979) at pp. 606-609. A circuit for a new digital to analog circuit suitable for use in connection with the digital to analog conversion system 10, which forms a further aspect of the invention, is shown as digital to analog converter 11A in the Figure. Digital to analog converter 11A includes a register 20, which receives and stores the DIG WRD A digital word "A" signals from the control circuit 12, an operational amplifier circuit 21, and a resistor ladder circuit 22.

As is conventional in an operational amplifier circuit for use in a digital to analog converter, operational amplifier circuit 21 includes an operational amplifier 23, having an inverting input terminal (−), non-inverting input terminal (+) and an output terminal which supplies the OUT VA signal, a feedback resistor R' and a biasing resistor $R_1$. The feedback resistor R' is connected between the output terminal of the operational amplifier 23 and its inverting input terminal, and the bias resistor $R_1$ is connected to bias the inverting terminal to a selected bias voltage level. With the operational amplifier circuit 21 having this configuration, and with resistor ladder circuit 22 being connected to the non-inverting terminal of operational amplifier 23, changes in the voltage level of the signal provided by the ladder circuit 22 will be directly reflected, in a non-inverting manner, in proportionate changes in the voltage level of the OUT VA provided by operational amplifier circuit 21.

The resistor ladder circuit 22, under control of the register 20, supplies a signal having a voltage level in proportion to a reference voltage level $V_R$, to a non-inverting input of the operational amplifier circuit 21 which, in turn controls the voltage level of the OUT VA signal. The resistor ladder circuit 22 includes a plurality of nodes 24(0) through 24(M) [generally identified by reference numeral 24(i)] which are interconnected by a series of resistors 27(1) through 27 (M−1) [generally identified by reference numeral 27(i)]. Node 24(M) is connected to the non-inverting terminal (+) of the operational amplifier 23. Each of the nodes 24(i) has depending therefrom a resistor 26(i) ("i" is representing the corresponding index values zero through "M") which is connected to a switch 25(i) which can connect the resistor either to ground or to reference voltage $V_r$. Each switch 25(i) is, in turn, controlled by a LAD CTRL (i) ladder control signal from a corresponding "i-th" bit 20(i) of the register 20. If a bit 20(i) is set, the corresponding LAD CTRL (i) signal is asserted to enable the switch 25(i) to connect the resistor 26(i) to the reference voltage $V_4$. On the other hand, if the bit 20(i) is clear, the corresponding LAD CTRL (i) signal is negated to enable the switch 25(i) to connect the resistor 26(i) to ground.

In addition to resistors 26(0) through 26(M) depending from the nodes 24(0) through 24(M), a resistor 26(−1) depends from node 24(0), and a resistor 26(M+1) depends from node 24(M). Both resistors 26(−1) and 26(M+1) are connected directly to ground.

The absolute resistances of resistors 26(i) (index "i" extending from "−1" through "M+1") and of resistors 27(i) generally will not determine the operation of a digital to analog converter, but their relative resistances will. If a "base resistance value" of "R" is selected, each resistor 27(i) has a relative resistance "R−ε" and each resistor 26(i) has a relative resistance "2(R+ε)," where "ε" is a value reflecting the precision of the resistors. In particular, "ε" has a value corresponding to the selected resistance value "R," multiplied by the precision of the resistors selected to implement the digital to analog circuit 11A. Thus, in an implementation of the digital to analog converter 11A, the resistances of the resistors 26(i) used to implement the circuit can actually extend from "2R" to "2(R+2ε)", whereas the resistances of the resistors 27(i) can actually extend from "R−2ε" to "R."

Since the resistances of the feedback resistor R' and of the bias resistor $R_1$ are fixed, the voltage of the OUT VA signal generated by operational amplifier 23 will be related to the reference voltage $V_R$ as follows:

$$V_O = (V_M)[(R_1 + R')/R_1] \qquad \text{Eqn.1}$$

where $V_M$ is the voltage level of node 24(M), which, as will be described below, is a function of reference voltage $V_R$, the particular switches 25(i) which connect their associated resistors 26(i) to ground, and the particular switches 25(i) which connected their respective associated resistors 26(i) to the reference voltage $V_R$. Since the factor "$(R_1 + R'/R_1)$" in Eqn. 1 is fixed, it will be ignored in the following explanation of the operation of digital to analog converter 11A.

Initially, the following discussion will assume that ε is zero. In that case, if the LAD CTRL (i) ladder control signal enables switch 25(i) to connect the resistor 26(i) to the reference voltage, treating the resistor ladder network 22 as a voltage divider and recognizing that the equivalent resistances to the left and right of the node 24(i) are effectively parallel resistance, the voltage level at node 24(i) is $$V_i = V_R\{(2R)/[2R + \tfrac{1}{2}(2R + 2R)]\} = \tfrac{1}{2} V_R \qquad \text{Eqn.2.}$$

Recognizing further that, at each node 24(j) from node 24(i) toward node 24(M) the current will divide, with half going toward resistor 27(j) and half toward resistor 26(j) since the equivalent resistances along each path from node 24(j) are the same. Accordingly, the voltage level at node 24(M) will be reduced by one-half at node 24(i+1), one fourth at node 24(i+2), and so forth, so that at node 24(M) the voltage level will be generally ($\tfrac{1}{2}$") the voltage level at node 24(i), or $$V_M = (V_R/3)(\tfrac{1}{2}^n) = (\tfrac{1}{2} V_R)(\tfrac{1}{2})^n \qquad \text{Eqn.3}$$

where "n" is the difference between "M" and "i," that is, the number of nodes from node 24(i) to node 24(M). If multiple LAD CTRL (i) ladder control signals are set, enabling respective switches 25(i) to connect respective resistors 26(i) to the reference voltage $V_R$, the voltage at the node 24(M) due to each such switch is added, so that the total voltage at node $V_M$ from various ones of the switches 25(i) being so conditioned is $$V_M = [a_M(\tfrac{1}{2})^0 + a_{M-1}(\tfrac{1}{2})^1 + a_{M-2}(\tfrac{1}{2})^2 + \ldots + a_0(\tfrac{1}{2})^M](\tfrac{1}{2} V_R) \qquad \text{Eqn.4.}$$

where "$a_i$" indicates the condition of the respective switch 25(i), reflecting, in turn, the value of the associated bit 20(i) in the register 20. Combining equations (1) and (4), the voltage level $V_O$ of the OUT VA output signal from operational amplifier 23 is $$V_O = [(R_1 + R')/R_1][a_M(\tfrac{1}{2})^0 + a_{M-1}(\tfrac{1}{2})^1 + a_{M-2}(\tfrac{1}{2})^2 + \ldots + a_0(\tfrac{1}{2})^M](\tfrac{1}{2} V_R) \qquad \text{Eqn.5.}$$

It will be appreciated that the bits 20(i) in register 20, which correspond to the values of coefficients $a_i$, effectively form a digital word having a binary-encoded numerical value. Accordingly, changing the value of the digital word in register 20 effectively enables a corresponding change in the voltage level $V_O$ of the output signal OUT VA of the operational amplifier 23.

Thus, in digital to analog converter 11A, if the resistors 26(i) all have exactly resistance values 2R, and if resistors 27(i) all have exactly resistance values R, the voltage level of output signal OUT VA will reflect the reference voltage level $V_R$, the fixed values of the bias resistor $R_1$ and feedback resistor R', and the particular conditions of the switches 25(i), but not the resistance of the resistors 26(i) and 27(i). This is a result of the fact that the resistors 26(i) and 27(i) all operate as voltage dividers, and their absolute resistance values will cancel, leaving the ratios of the resistances, as reflected in equations 4 and 5. However, in an actual circuit implementation, the resistors 26(i) and 27(i) will have some tolerance percentage, and their resistance values will not divide exactly as reflected in equations 4 and 5. A result is that the change in voltage level $V_o$ of the output signal OUT VA, with changes in values of the digital word stored in register 20, may not necessarily be monotonic. That is, the tolerance for the actual resistance value for an actual resistor may be such that an change in the value of the digital data word in register 20 may result in an inverse change in the output voltage level $V_o$.

To correct this problem, the value of "ε" is selected to be non-zero, and in particular is chosen to reflect the tolerance of the resistors selected to implement the circuit of digital to analog converter 11A. Thus, the nominal resistance value of each resistor 27(i) is selected to be such that the maximum actual resistance is R, and accordingly the nominal resistance value will be R−ε. In that case, since the tolerance around the nominal resistance value is ε, the actual range of resistance values for resistors 27(i) which will be used in an actual implementation of the digital to analog converter 11A will be the nominal resistance value R−ε, plus and minus the tolerance resistance value ε, which means that the actual resistors used in a circuit for the digital to analog converter will fall within a range of R−2ε to R. Similarly, the nominal resistance value of each resistor 26(i) is selected to be such that the minimum actual resistance is 2R, and accordingly the nominal resistance value will be 2(R+ε). In that case, since the tolerance around the nominal resistance value is 2ε, the actual range of resistance values for resistors 26(i) will be 2R to 2R+4ε.

With the resistance values of the resistors 26(i) and 27(i) so constrained, the voltage levels of the various nodes 24(i) will tend to be exactly or somewhat below the levels indicated by equation (2) and the progression of increasing voltage levels of node 24(M) with changes in switch settings represented by increasing values of the digital word in register 20, will be monotonically related to the change in the value of the digital data word provided to register 20. In addition, the progression of increasing voltage levels of node 24(M) with changes in switch settings represented by increasing values of the digital word in register 20, will be generally, but, since the actual resistances of the resistors 26(i)

and 27(i) used in an actual implementation of the digital to analog converter 11A will include will fall within the tolerance range of their respective nominal resistances, not necessarily exactly, proportional to the change in the value of the digital data word provided to register 20.

With this background, in response to INP CMD input command signals representing, for example, a value identifying a voltage level, the control circuit 12 generally performs a number of operations to enable the voltage level of the OUT Vs signal to reach the voltage level specified by the INP CMD signals. In these operations:

(a) The control circuit 12 initially determines whether the voltage level of the OUT $V_s$ signal is within a selected voltage window or range around the desired voltage level, and if so, leaves the conditions of the system 10 unchanged. In making the determination, the control circuit may compare the voltage level of the OUT VS signal to a standard voltage, or may generate a digital value identifying the voltage level.

(b) If the control circuit 12 determines in step (a) that the voltage level of the OUT VS signal is outside of the window, it determines whether it is above or below the desired voltage level.

(c) With the A/B SEL signal enabling the selector 13 to currently couple the output signal OUT Vi' from digital to analog converter 11i' as the OUT Vs signal, and if the voltage level of the OUT VS signal is below the desired voltage level, the control circuit 12, in one or more iterations, iteratively generates DIG WRD i" signals to control the currently unselected digital to analog converter 11i" to enable its output signal OUT Vi" to approach the desired output voltage, until the $V_A$ GT $V_B$ and $V_B$ GT $V_A$ signals indicate that the voltage level of the output signal OUT Vi" of the unselected digital to analog converter 11i" is just above that of the selected digital to analog converter 11i'. In performing this step, the control circuit 12:

i] Determines whether the voltage level of the OUT Vi' signal, provided by the unselected digital to analog converter 11i", is above or below the voltage level of the OUT VS signal, as determined by the conditions of the $V_A$ GT $V_B$ and $V_B$ GT $V_A$ signals from the voltage comparator circuit 14. If the control circuit 12 determines that voltage level of the OUT Vi" signal from the unselected digital to analog converter 11i" is above the voltage level of the OUT Vi' from the selected digital to analog converter 11i', it enables the unselected digital to analog converter 11i" to reduce the voltage level of its OUT Vi" signal to a level just below that of the OUT Vi" signal provided by the selected digital to analog converter. In that operation:

A] The control circuit 12 transmits DIG WRD i" digital word signals to the unselected digital to analog converter 11i" representing a numerical value which is a decrementation from the value represented by the DIG WRD i" signals it is currently transmitting, thereby enabling the unselected digital to analog converter 11i" to reduce the voltage level of the OUT Vi" signal.

B] The control circuit 12 determines from the $V_A$ GT $V_B$ and $V_B$ GT $V_A$ signals whether the voltage level $V_{i'}$ of the OUT Vi" signal of the unselected digital to analog converter 11i" is less than the voltage level $V_{i'}$ of the OUT Vi' signal of the selected digital to analog converter 11i', and if not returns to step (c)(i)(A). Otherwise, the control circuit 12 steps to step (c)(ii).

ii] After determining that the voltage level $V_{i'}$ signal from the unselected digital to analog converter 11i" is below the voltage level $V_{i'}$ of the OUT Vi" of the selected digital to analog converter 11i', the control circuit 12 generates DIG WRD i signals representing an incremented value to the unselected digital to analog converter 11i".

iii] The control circuit 12 tests the $V_A$ GT $V_B$ and $V_B$ GT $V_A$ signals to determine whether the voltage level $V_{i'}$ of the OUT Vi" signal of the unselected digital to analog converter 11i" is greater than the voltage level of the selected digital to analog converter 11i', and if not, returns to step (c)(i).

(d) The control circuit 12 then complements the A/B SEL "A" or "B" select signal to enable the selector circuit 13 to couple the OUT Vi" signal from the unselected digital to analog converter 11i" as the OUT VS signal, thereby making that digital to analog converter "selected" and the previously selected digital to analog converter "unselected".

(e) The control circuit 12 then returns to step (a) to repeat these operations.

It will be appreciated that, in performing these operations, the control circuit 12, during a series of iterations, effectively controls alternate ones of the digital to analog converters, during each iteration the "unselected" analog to digital converter 11i", to generate OUT Vi" output signals of voltage levels which are slightly increased over the voltage level of the output signal OUT Vs currently being transmitted by the selector circuit 13 in response to OUT Vi' output signals from the "selected" analog to digital converter 11i'. During the iteration the control circuit 12 further enables the selector circuit 13 to couple the adjusted signal from the currently unselected digital to analog converter 11i", as the OUT Vs output signal.

To enable the unselected digital to analog converter 11i" to generate an output signal OUT Vi" whose voltage level $V_{i'}$ is somewhat higher than the voltage level $V_{i'}$ of the OUT Vi', signal, the control circuit 12 initially enables the unselected digital to analog converter 11i" to reduce the voltage level $V_{i'}$ of its output signal OUT Vi" to a level below that of the output signal OUT Vi' of the selected analog to digital converter 11i', as described above in connection with steps (c)(i)(A) and (c)(i)(B). This will ensure, that, after the control circuit 12 has enabled the unselected digital to analog converter 11i" to increase the voltage level $V_{i'}$ of its output signal OUT Vi" to a level above that of the output signal OUT Vi' of the selected digital to analog converter 11i', as described in steps (c)(ii) and (c)(iii), the voltage level $V_{i'}$ will be above the voltage level $V_{i'}$ of the output signal OUT Vi' of the selected digital to analog converter 11i', but not substantially thereabove. As a result, when the control circuit 12 enables the selector circuit 13 to couple the OUT Vi" output signal from the unselected digital to analog converter 11i" as the OUT Vs selected output signal in step (d) the voltage level of the OUT Vs signal will be somewhat, but not excessively, increased, providing for a relatively smooth transition from one voltage level to the next. These operations will be repeated, as indicated in step (e), through a series of iterations, until the voltage level $V_s$ of the output signal OUT Vs is within the required window around the voltage level identified by the INP CMD signals.

It will be appreciated that the control circuit 12 uses the $V_A$ GT $V_B$ and $V_B$ GT $V_A$ signals to verify relative voltage levels of the selected and unselected digital to analog converters 11$i'$ and 11$i''$, rather than rely on the relative numerical values represented by the DIG WRD $i'$ and DIG WRD $i''$ signals. Each digital to analog converter 11$i$ is configured, as described above, to ensure that providing DIG WRD $i$ signals of increasing or decreasing numerical values will ensure that that digital to analog converter will increase or decrease the voltage level $V_i$ of its output signal OUT V$i$. However, because of differences inherent in the different components used in the two digital to analog converters, the actual voltage levels $V_i$ of their respective output signals OUT V$i$ will not necessarily be the same for the same values represented by the OUT V$i$ signals.

While the operation of the system 10 described above has been in relation to increasing the voltage level $V_s$ of the output signal OUT Vs, it will be appreciated that the system 10 can also decrease its voltage level. In decreasing the voltage level $V_s$ of the output signal OUT Vs, the control circuit 12 performs substantially the complement of the operations (a) through (e) as described above, that is, relative levels, such as "above" and "below" would be interchanged, as would directions such as "increment" and "decrement" as well as "increase" and "decrease."

A circuit which would be appropriate for control circuit 12 is similar to circuitry described in connection with the aforementioned Hillis, et al., application, which can be adapted to use in digital to analog conversion system 10 without undue experimentation.

The digital to analog conversion system 10 provides a number of advantages. For example, the system 10, in response to INP CMD input command signals, can adjust the voltage level $V_s$ of the output signal OUT Vs in a relatively gradual manner, which can minimize likelihood of ringing, that is, oscillations of the output signal which may occur when a large, relatively sudden voltage change takes place. In addition, the system 10 ensures the change in the voltage level in response to the INP CMD signals is monotonic.

Further, while the system 10 has been described as facilitating generation of an OUT Vs selected output signal having a fixed voltage level $V_s$ which is determined by the INP CMD input command signals, it will be appreciated that the system 10 may facilitate generation of the OUT Vs signal having complex voltage level patterns. For example, the INP CMD signals may enable the system 10 to generate the OUT Vs signal in a pattern which transitions between two voltage levels, effectively generating a sinusoidal-like pattern. System 10 may also provide the OUT Vs signal in other voltage level patterns.

The foregoing description has been limited to a specific embodiment of this invention. It will be apparent, however, that various variations and modifications may be made to the invention, with the attainment of some or all of the advantages of the invention. It is the object of the appended claims to cover these and such other variations and modifications as come within the true spirit and scope of the invention.

What is claimed as new and desired to be secured by Letters Patent of the United States is:

1. A circuit comprising:
   A. two digital to analog converters, each generating an output signal having a voltage level variable in response to a control signal;
   B. a selector circuit connected to said digital to analog converters for selectively coupling as a system output signal the output signal from one of said digital to analog converters in response to a selection signal;
   C. a control circuit for generating control signals for controlling said digital to analog converters and said selection signal for controlling said selector circuit to, during a series of iterations, effectively control alternate ones of the digital to analog converters to generate output signals of voltage levels which are adjusted in relation to the voltage level of the system output signal and enable the selector circuit to couple the adjusted output signal as the system output signal, to thereby enable the system output signal to approach a selected voltage level.

2. A circuit as defined in claim 1 in which said selected voltage level is identified by a digitally-encoded signal.

3. A circuit as defined in claim 1 further including a voltage comparator circuit for receiving output signals from said digital to analog converters and for generating a signal representative of the relative voltage levels thereof, said control circuit generating said control signals for controlling said digital to analog converters and said selection signal for controlling said selector circuit in response thereto.

4. A circuit as defined in claim 1 in which at least one of said digital to analog converters comprises:
   A. an amplifier circuit for generating said output signals having a voltage level determined by the voltage level of an input signal at an input terminal;
   B. a resistor network comprising:
      i. a plurality of series-connected resistors connected between a selected base voltage and said input terminal of said amplifier circuit, connections between each pair of resistors defining a node;
      ii. a plurality of depending resistors each having one terminal connected to a node; and
      iii. a plurality of switch circuits each having an input terminal connected to one of said depending resistors, each switch circuit being independently controllable to selectively connect said input terminal to said selected base voltage or to a selected reference voltage in response to a switch control signal derived from the control signal from said control circuit,
   wherein, if the resistance value of each of said series-connected resistors and said depending resistors is defined in accordance with a base value of R and a tolerance of $\epsilon$, said series connected resistors each have a nominal resistance value $R-\epsilon$, and said depending resistors each have a nominal resistance value $2(R+\epsilon)$.

5. A digital to analog converter comprising:
   A. an amplifier circuit for generating said output signals having a voltage level determined by the voltage level of an input signal at an input terminal;
   B. a resistor network comprising:
      i. a plurality of series-connected resistors connected between a selected base voltage and said input terminal of said amplifier circuit, connections between each pair of resistors defining a node;
      ii. a plurality of depending resistors each having one terminal connected to a node; and iii. a plurality of switch circuits each having an input terminal connected to one of said depending resistors, each switch circuit being independently controllable to selectively connect said input terminal to said selected base voltage or to a selected reference voltage in response to a switch control signal;

wherein, if the resistance value of each of said series-connected resistors and said depending resistors is defined in accordance with a base value of R and a tolerance of $\epsilon$, said series connected resistors each have a nominal resistance value $R-\epsilon$, and said depending resistors each have a nominal resistance value $2(R+\epsilon)$.

* * * * *